(12) United States Patent
Steimle et al.

(10) Patent No.: US 6,964,902 B2
(45) Date of Patent: Nov. 15, 2005

(54) METHOD FOR REMOVING NANOCLUSTERS FROM SELECTED REGIONS

(75) Inventors: Robert F. Steimle, Austin, TX (US); Jane A. Yater, Austin, TX (US); Gowrishankar L. Chindalore, Austin, TX (US); Craig T. Swift, Austin, TX (US); Steven G. H. Anderson, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/787,510

(22) Filed: Feb. 26, 2004

(65) Prior Publication Data
US 2005/0191808 A1  Sep. 1, 2005

(51) Int. Cl.$^7$ .......................................... H01L 21/336
(52) U.S. Cl. ...................... 438/258; 438/260; 257/258; 257/298; 257/314; 257/500; 365/185.29
(58) Field of Search ............................... 438/128, 142, 438/197, 260, 478, 258, 610; 257/368; 365/185.29

(56) References Cited

U.S. PATENT DOCUMENTS

| 6,400,610 B1 * | 6/2002 | Sadd ..................... 365/185.29 |
| 6,531,731 B2 * | 3/2003 | Jones et al. ................. 257/314 |
| 2003/0132500 A1 * | 7/2003 | Jones et al. ................. 257/500 |
| 2004/0150024 A1 * | 8/2004 | Mazoyer et al. ............ 257/298 |
| 2004/0266107 A1 * | 12/2004 | Chindalore et al. ......... 438/258 |
| 2005/0059213 A1 * | 3/2005 | Steimle et al. .............. 438/260 |

OTHER PUBLICATIONS

Kim, Dong-Won et al.; "Charge retention characteristics of SiGe quantum dot flash memories"; Conference Digest of 60$^{th}$ Device Research Conference; 2002; 1 pg abstract & pp151-152; IEEE; USA.

Zhu, Jane G. et al; "Effects of Ion Beam Mixing on the Formation of SiGe Nanocrystals by Ion Implantation"; Proceedings of the 11$^{th}$ International Conference of Ion Implantation Technology; Jun. 16-21, 1996; 1 pg abstract & pp 690-693; IEEE; USA.

* cited by examiner

*Primary Examiner*—Matthew Smith
*Assistant Examiner*—Belur V. Keshavan
(74) *Attorney, Agent, or Firm*—Robert L. King; Joanna G. Chiu

(57) ABSTRACT

Nanoclusters are blanket deposited on an integrated circuit and then removed from regions where the nanoclusters are not desired. A sacrificial layer is formed in those regions where the nanoclusters are not desired prior to the blanket deposition. The nanoclusters and the sacrificial layer are then removed. In one form, the sacrificial layer includes a deposited nitride containing or oxide containing layer. Alternatively, the sacrificial layer includes at least one of a pad oxide or a pad nitride layer previously used to form isolation regions in the substrate. Nanocluster devices and non-nanocluster devices may then be integrated onto the same integrated circuit. The use of a sacrificial layer protects underlying layers thereby preventing the degradation of performance of the subsequently formed non-nanocluster devices.

26 Claims, 11 Drawing Sheets

METHOD FOR REMOVING NANOCLUSTERS FROM SELECTED REGIONS

FIELD OF THE INVENTION

This invention relates generally to semiconductors, and more specifically, to processing of semiconductors having nanoclusters.

BACKGROUND OF THE INVENTION

Nanoclusters, including nanocrystals, are structures of a single chemical composition which are typically in the range of one to twenty-five nanometers in diameter. Nanoclusters are used as semiconductor memory storage elements and as optoelectronic devices for semiconductor applications.

When nanoclusters are embedded into a portion of an integrated circuit, the nanoclusters that are deposited in the periphery region have to be removed prior to the formation of peripheral devices. During deposition, nanoclusters of different sizes and shapes are formed. Some deposited nanoclusters are much larger than others while others are oblong in shape. The deposition of nanoclusters is not selective across a semiconductor substrate. Therefore, in some areas of an integrated circuit, the nanoclusters must be removed after the blanket deposition. The presence of random size distributions of nanoclusters is problematic as some nanoclusters are typically left in place when conventional etching processes are used. Even with tight nanocluster processing control that results in a narrow dispersion of cluster sizes, the presence of a few substantially larger clusters on the peripheral area is not statistically insignificant. When nanoclusters are deposited on a thin oxide surface, a long wet etch or dry etch is required to remove nanoclusters substantially larger than the mean size. This long wet or dry etch may compromise the integrity of devices built on the periphery. Selective removal of nanoclusters is therefore problematic.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
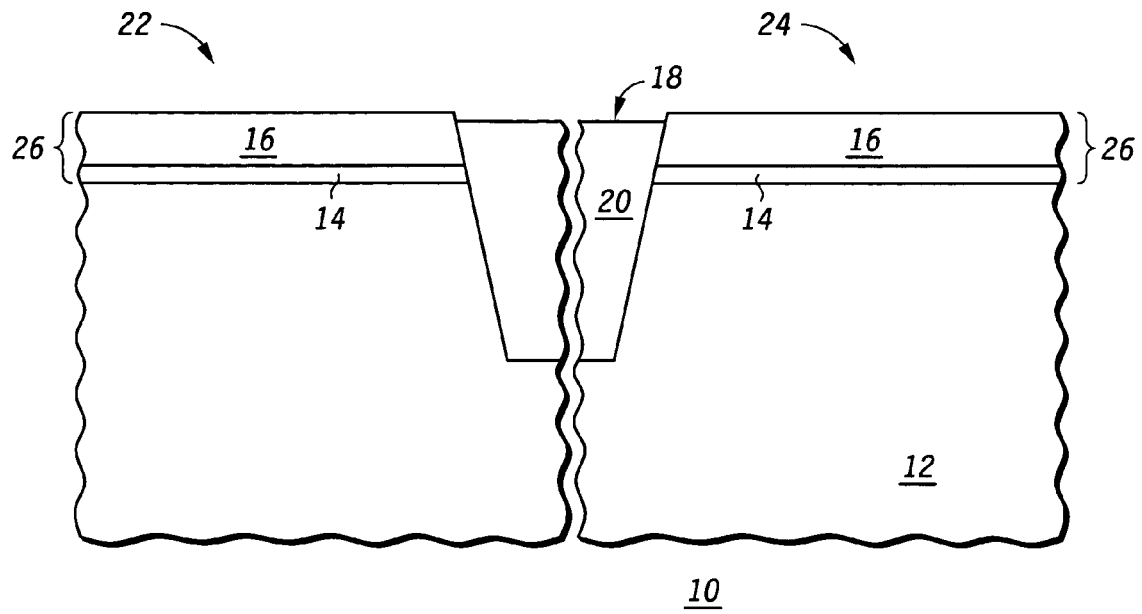
FIGS. 1–12 illustrate in cross-sectional form an embodiment of a method for removing nanoclusters from selected regions of an integrated circuit.

Illustrated in FIG. 1 is a cross section of an integrated circuit 10 which will contain nanoclusters in a portion thereof. The integrated circuit 10 has a substrate 12 formed of one of a variety of semiconductor materials. For example, substrate 12 may be single crystal silicon. A pad oxide layer 14 which serves as a stress relief layer overlies the substrate 12. In one form, the pad oxide layer 14 is an oxide, such as silicon oxide. Overlying pad oxide layer 14 is a pad layer 16 formed of a dielectric, such as silicon nitride. Trenches, such as a trench 18, are commonly used in an integrated circuit to electrically isolate semiconductor devices from each other. In the illustrated form, a periphery region 22 is defined separately from a nanocluster region 24. The periphery region 22 is illustrated as being separated from the nanocluster region 24 by a break in integrated circuit. Trench 18 is filled with trench fill material 20 that is an electrical insulating material. The nanocluster region 24 is a region where nanoclusters will be used. The periphery region 22 is a region where no nanoclusters (i.e. a non-nanocluster region) will be permitted to remain. For example, in the periphery region 22 the circuitry includes a variety of non-nanocluster devices, such as high voltage transistors, logic gates, input/output (I/O) transistors and other devices that do not contain nanoclusters. An example of a device within the nanocluster region 24 is a nonvolatile memory (NVM) cell.

Figure 2:
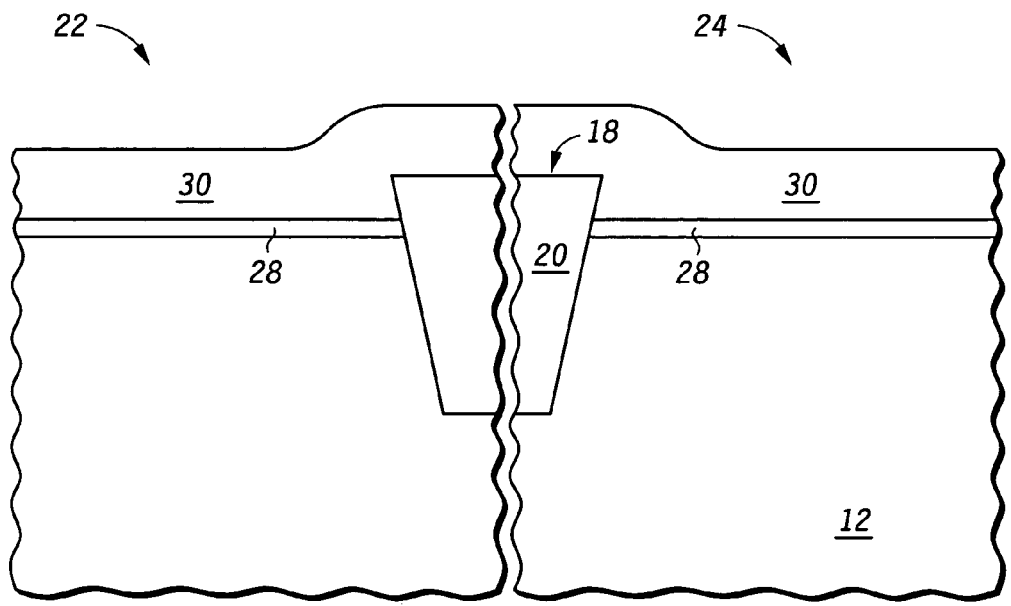

Illustrated in FIG. 2 is further processing of integrated circuit 10. For convenience of illustration, elements that are common in FIGS. 1–13 are given the same reference number throughout the discussion. Both pad layer 16 and pad oxide layer 14 have been removed. In one form, these two layers are removed by a conventional wet etch. These two layers were present overlying substrate 12 for formation of the trench 18 which is conventional and will not be discussed further. A sacrificial oxide layer 28 is grown over substrate 12. The purpose of sacrificial oxide layer 28 is to provide an undamaged upper surface of substrate 12 during subsequent processing and hence, improve the electrical characteristics (i.e. the electron mobility, etc.). An overlying conformal sacrificial layer 30 is deposited over both the sacrificial oxide layer 28 and the trench 18. Various materials may be used for conformal sacrificial layer 30 including deposited oxides such as tetraethoxysilane (TEOS), silicon nitride and polycrystalline silicon. Other materials may be used, such as high dielectric constant (high K) materials.

Figure 3:
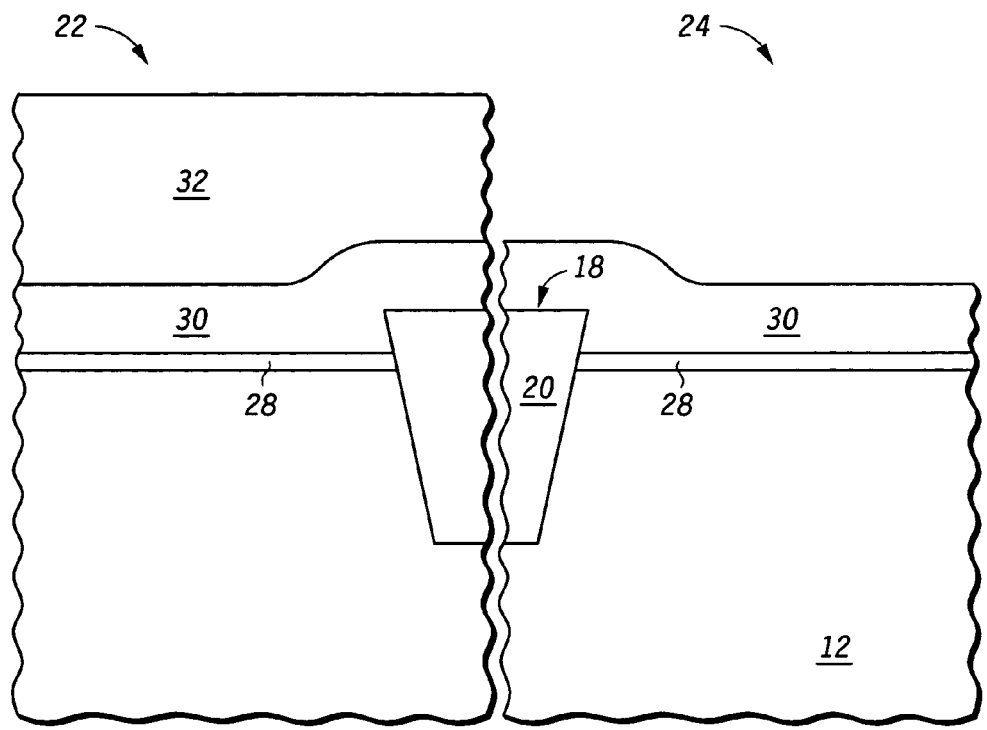

Illustrated in FIG. 3 is further processing of integrated circuit 10. A masking layer 32 is selectively placed over the circuitry of periphery region 22. The masking layer 32 is any of several conventional masking materials, such as photoresist.

Figure 4:
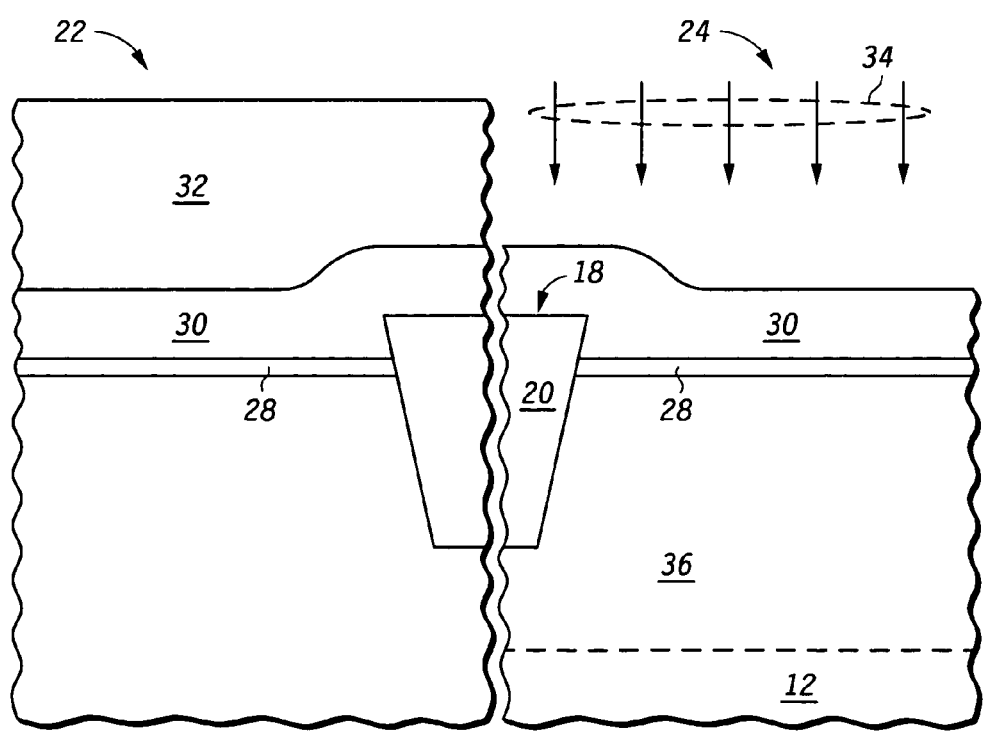

Illustrated in FIG. 4 is further processing of integrated circuit 10 using the masking layer 32. A conventional ion implant 34 is implemented to implant ions into substrate 12 in nanocluster region 24. As a result, a well 36 is formed within substrate 12 of the nanocluster region 24. In the illustrated form, the implant 34 is performed in the presence of conformal sacrificial layer 30. However, alternative implementations exist. For example, conformal sacrificial layer 30 may be removed in the nanocluster region 24 and the implant 34 implemented with sacrificial oxide layer 28 exposed.

Figure 5:
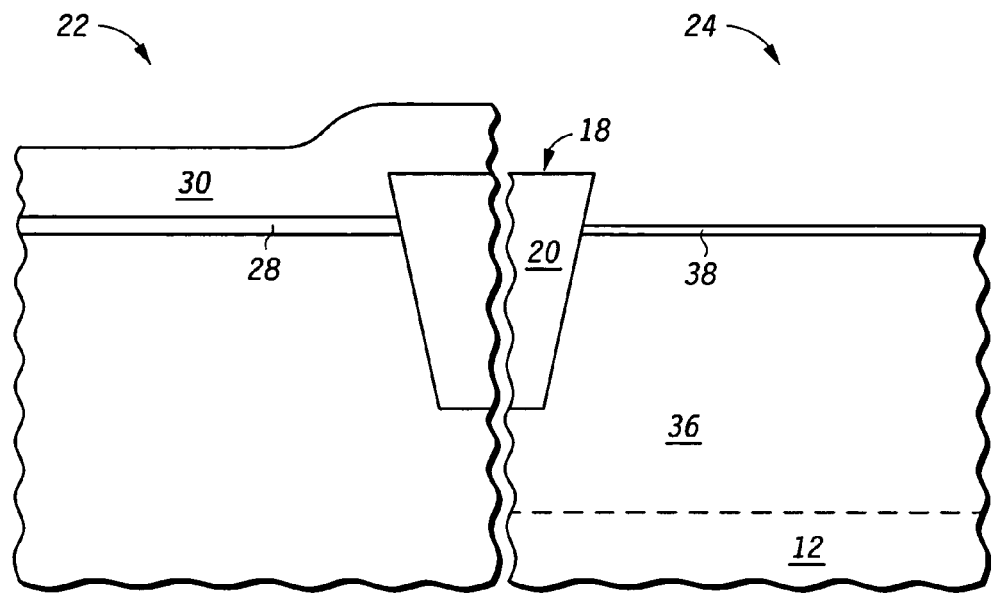

Illustrated in FIG. 5 is further processing of integrated circuit 10. Conformal sacrificial layer 30 is removed from the nanocluster region 24 by either a dry etch or a wet etch. Also, sacrificial oxide layer 28 is removed from the nanocluster region 24 by a wet etch. The masking layer 32 is removed. At this point in time, a bottom oxide layer 38 is formed overlying the substrate 12 and well 36 in nanocluster region 24. The bottom oxide layer 38 functions as an electrical insulator or dielectric overlying well 36.

Figure 6:
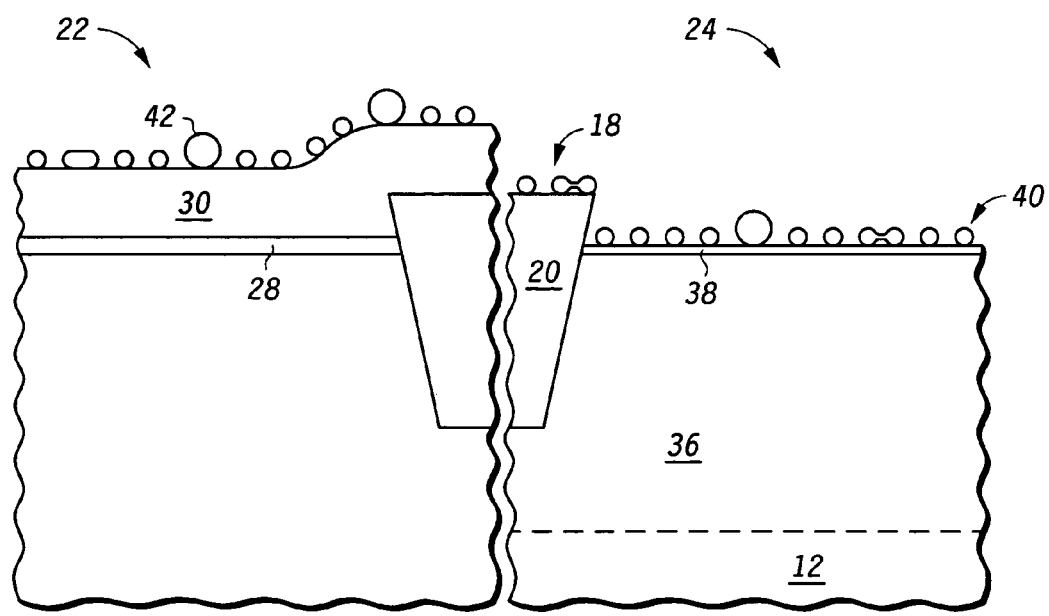

Illustrated in FIG. 6 is further processing of integrated circuit 10 in which nanoclusters are uniformly deposited. A plurality of nanoclusters 40 of varying size (i.e. varying diameter lengths) and varying shapes form on all the exposed surfaces as a result of a conventional deposition of nanoclusters. The nanoclusters 40 may be one of a variety different materials. For example, nanoclusters of doped and undoped semiconductors such as silicon, silicon germanium, germanium, carbon, compound semiconductors, and metals including, but not limited to, gold, platinum, metal alloys and combinations thereof may be formed. These materials may be deposited by various conventional techniques such as CVD, aerosol techniques and wet chemical techniques. The distribution of the various sizes of the nanoclusters 40 is random and some nanoclusters 40, such as nanocluster 42, are much larger than other nanoclusters. Additionally, the nanoclusters 40 may be of various shapes, include oblong and dog-bone or bar bell shaped.

Figure 7:
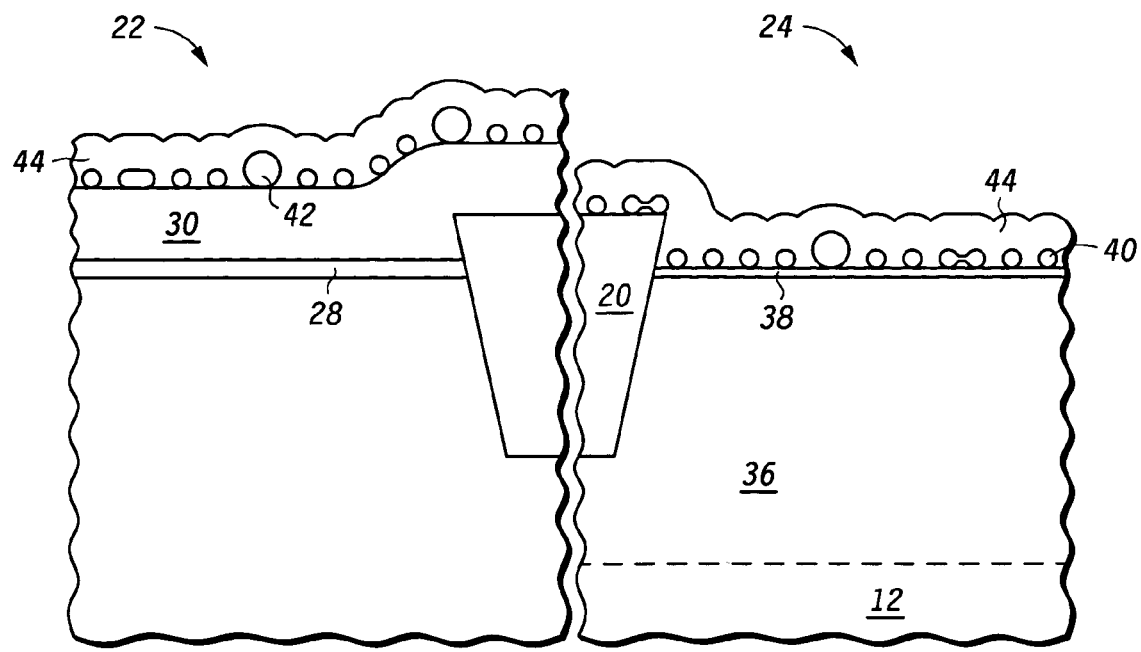

Illustrated in FIG. 7 is further processing of integrated circuit 10 in which a top dielectric layer 44 is deposited overlying the nanoclusters 40 within both periphery region 22 and nanocluster region 24. The top dielectric layer 44 is deposited by a conventional deposition process, such as CVD. Top dielectric layer 44 may be any of a variety of dielectric materials, such as an oxide or a nitride. Further, top dielectric layer 44 may be formed of a laminate of materials, such as silicon oxide and silicon nitride. Note that the deposition is conformal and may therefore be nonplanar. The function of the top dielectric layer 44 is to provide electrical isolation between nanocluster materials and the overlying structure.

Figure 8:
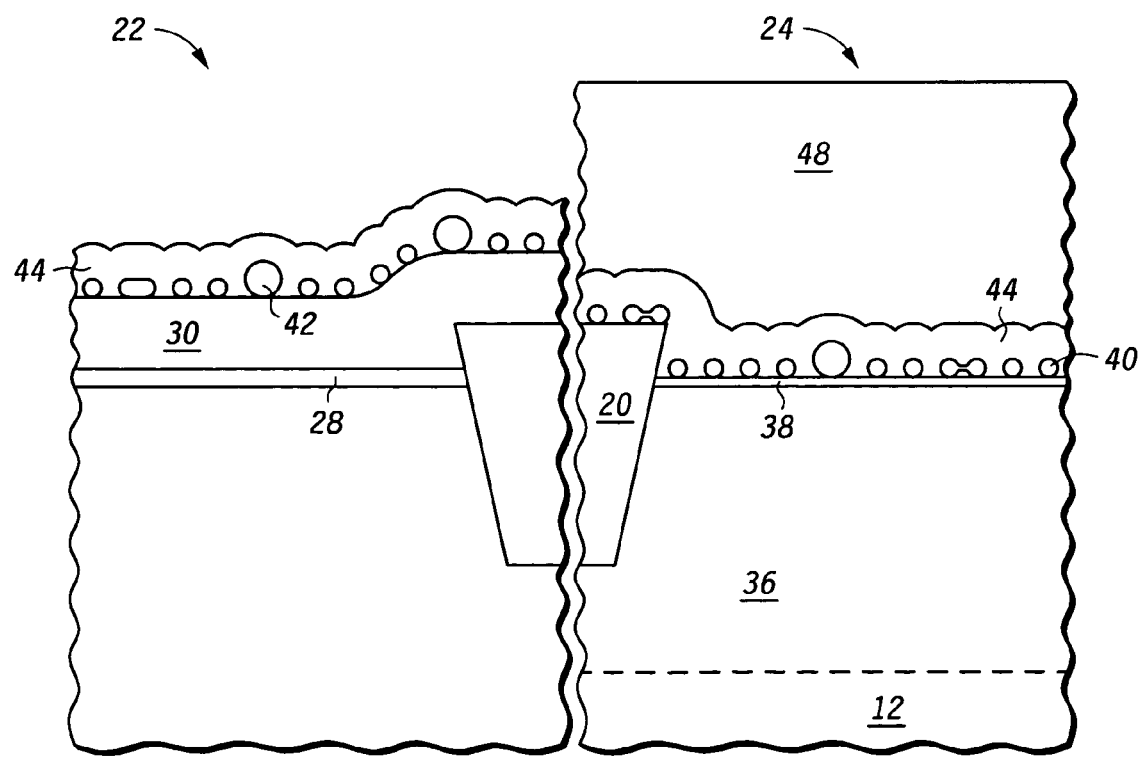

Illustrated in FIG. 8 is further processing of integrated circuit 10 in which a masking layer 48 is placed over nanocluster region 24 of integrated circuit 10. The masking layer 48 may be of any conventional masking material, such as photoresist.

Figure 9:
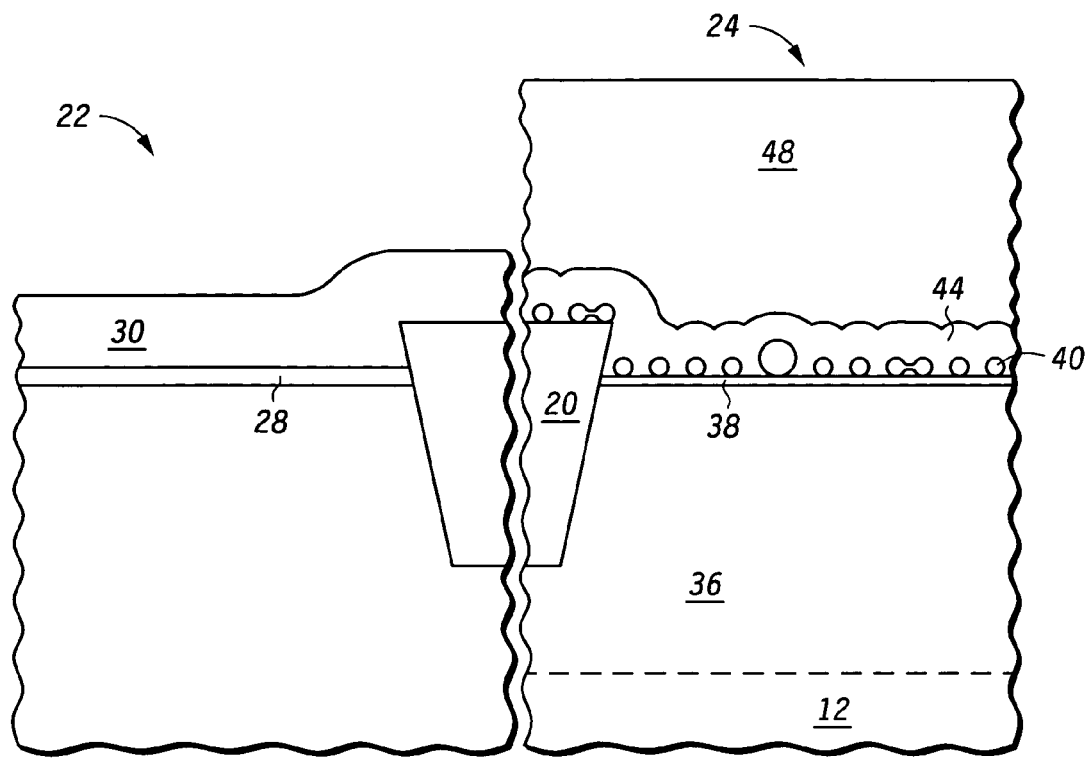

Illustrated in FIG. 9 is further processing of integrated circuit 10 in which the top dielectric layer 44 and nanoclusters 40 within the periphery region 22 are removed by an etch. In one form, assume that the conformal sacrificial layer 30 is composed of nitride and top dielectric layer 44 is composed of oxide. With these materials, a dry etch will have a strong endpoint signal available to distinguish between the top dielectric layer 44 and the conformal sacrificial layer 30 when etching away top dielectric layer 44. Therefore, the nanoclusters 40 in periphery region 22 may be etched or removed selective to the conformal sacrificial layer 30 without removing a significant portion of the conformal sacrificial layer 30. Furthermore, because sacrificial layer 30 is of a different material than the top dielectric layer 44 complete removal of all the nanoclusters, including the large nanoclusters may be accomplished with assurance with a single dry etch without any wet etches.

In an alternative embodiment, the conformal sacrificial layer 30 is composed of TEOS and top dielectric layer 44 is composed of oxide. With these compositions a wet etch chemistry may be reliably used to undercut the nanoclusters without resorting to excessively long over-etch times. TEOS and deposited control oxides will etch more quickly and selectively to grown oxides. The etch rate of TEOS is approximately one and one-half to three times as fast as thermal oxide. Thus large nanoclusters are undercut more thoroughly with a shorter etch than from a thermal oxide substrate. Nanoclusters that have been undercut and which adhere to the substrate due to electrostatic forces may be subsequently pulled away by using a basic solution to help neutralize the electrostatic attraction such as a standard clean one (SC1) which is a solution of ammonium hydroxide, hydrogen peroxide and deionized water. The SC1 clean is accompanied by mechanical action such as an ultrasonic or megasonic clean. A brush scrubber such as conventionally used for chemical mechanical polishing (CMP) may also be used to provide the mechanical action. During the clean steps, the previous undercutting frees the nanoclusters entrapped in the conformal sacrificial layer 30 and top dielectric layer 44. The basic solution accompanied by mechanical action then removes the nanoclusters from the surface of the integrated circuit 10.

Figure 10:
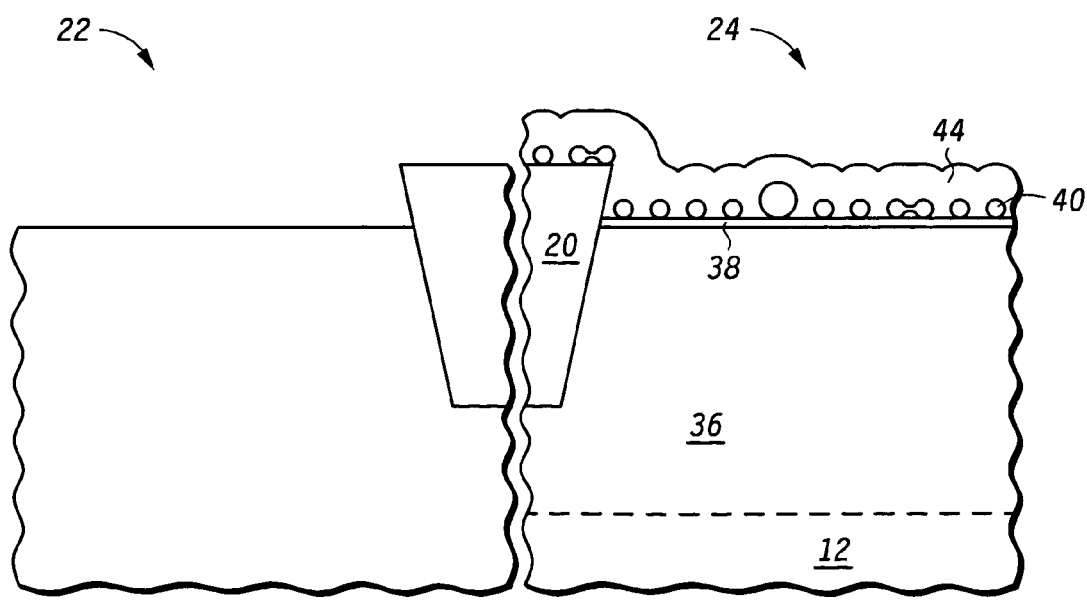

Illustrated in FIG. 10 is further processing of integrated circuit 10 in which the masking layer 48 is removed from nanocluster region 24 by a conventional mask removal step. Prior to removal of masking layer 48, the conformal sacrificial layer 30 and the sacrificial oxide layer 28 in periphery region 22 are removed. If the conformal sacrificial layer 30 is composed of TEOS, a wet etch is used to remove both layers. If conformal sacrificial layer 30 is composed of nitride, a dry etch is performed prior to the removal of masking layer 48. Sacrificial oxide layer 28 is then removed from periphery region 22 by a conventional wet etch.

Figure 11:
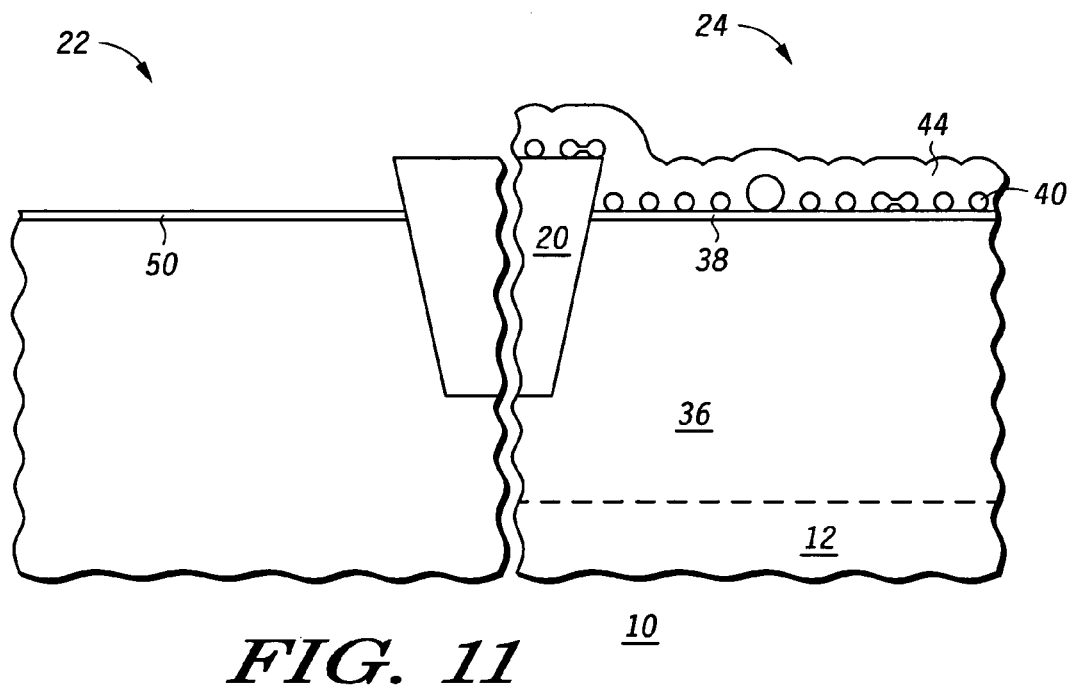

Illustrated in FIG. 11 is further processing of integrated circuit 10. In FIG. 11 a dielectric layer 50 is either deposited or thermally grown over substrate 12 in periphery region 22.

Figure 12:
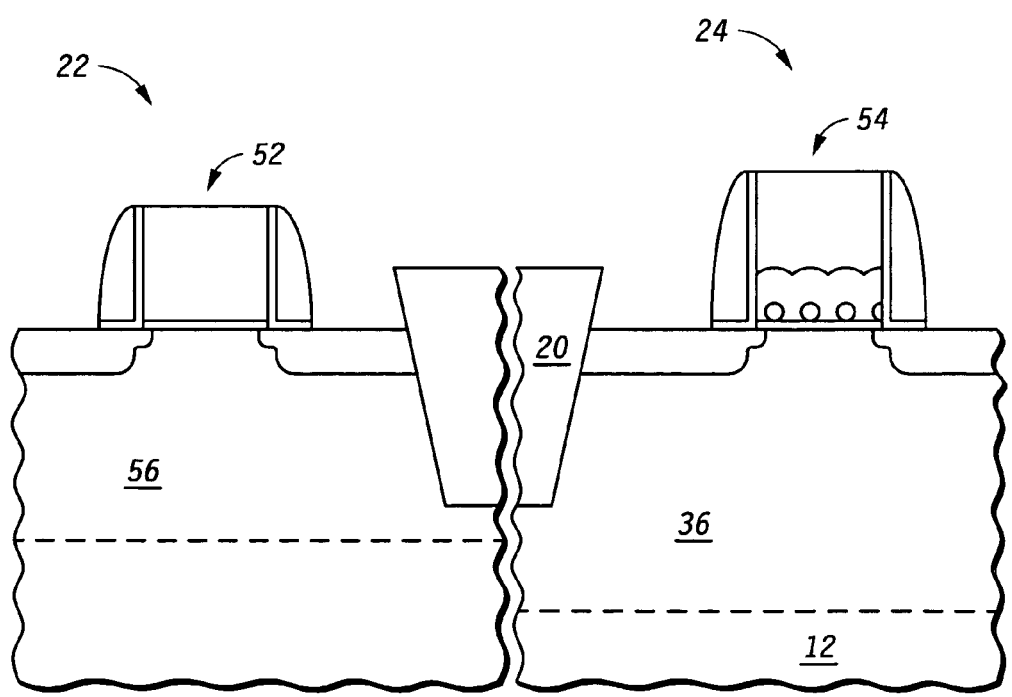

Illustrated in FIG. 12 is further processing of integrated circuit 10 in which a non-nanocluster device 52 is completed in periphery region 22 and a nanocluster device 54 is completed in nanocluster region 24. In the illustrated form, the non-nanocluster device 52 is a conventional transistor having sidewall spacers and self-aligned source and drain regions (not numbered) formed within a well region 56. The non-nanocluster device 52 functions as a transistor in any of a variety of predetermined types of circuit applications. In nanocluster region 24, the nanocluster device 54 functions as a memory cell and more specifically as an NVM memory cell. The nanoclusters function as a storage element for the structure. Formation of sidewall spacers and source and drain regions may be done concurrently with the formation of analogous structural elements in the non-nanocluster device 52. While specific device structures are illustrated in the form of non-nanocluster device 52 and nanocluster device 54, it should be understood that any type of electronic structure may be implemented in periphery region 22 and in nanocluster region 24. For example, the nanoclusters that are not removed in nanocluster region 24 may be used in an optical device. Any type of electronic device may be implemented in non-nanocluster device 52, including passive elements as well as active elements. Therefore, it should be apparent that in FIGS. 1–12 there has been provided a method of providing an integrated circuit that contains two regions, one having nanoclusters and the other not having nanoclusters.

Figure 13:
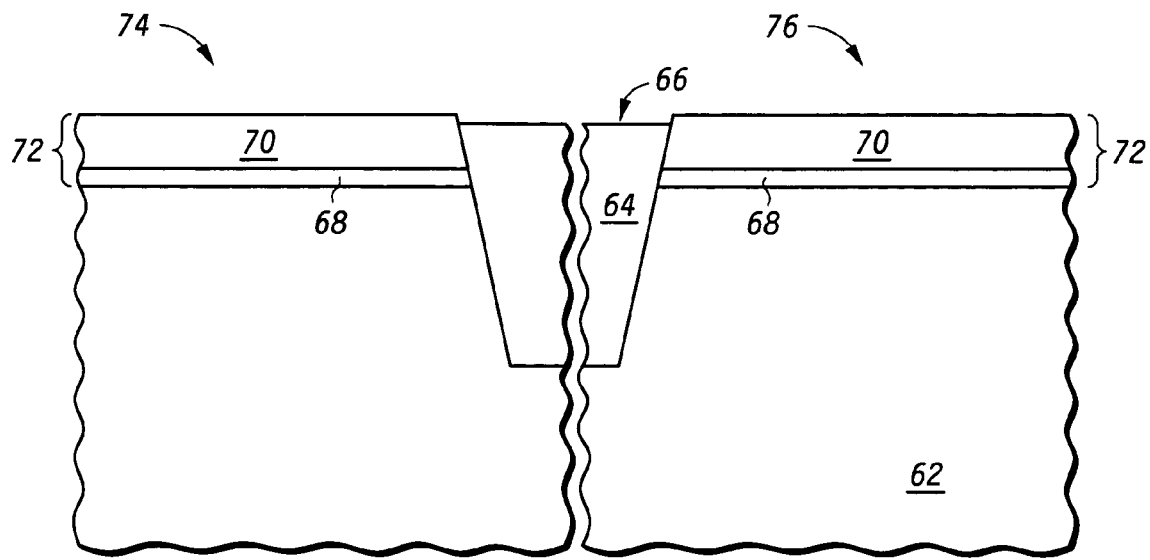
FIGS. 13–21 illustrate in cross-sectional form another embodiment of a method for removing nanoclusters from selected regions of an integrated circuit.

Illustrated in FIGS. 13–21 is another form of a method of selective removal of nanoclusters in an integrated circuit having separate sections of circuitry with nanoclusters and circuitry without nanoclusters. For convenience of illustration, elements that are common in these figures are given the same reference number throughout the discussion. A cross section of an integrated circuit 60 which will contain nanoclusters in a portion thereof is illustrated. In FIG. 13, the integrated circuit 60 has a substrate 62 formed of one of a variety of semiconductor materials. For example, substrate 62 may be single crystalline silicon. A pad oxide layer 68 which serves as a stress relief layer overlies the substrate 62. Pad oxide layer 68 is silicon oxide or other oxides. Overlying pad oxide layer 68 is a pad layer 70 formed of a dielectric, such as silicon nitride. Pad oxide layer 68 and pad layer 70 together form a sacrificial layer 72. Trenches, such as a trench 66, are commonly used in an integrated circuit to electrically isolate semiconductor devices from each other.

In the illustrated form, a non-nanocluster region or a periphery region 74 is defined separately from a nanocluster region 76. The periphery region 74 is illustrated as being separated from the nanocluster region 76 by a break in integrated circuit. Trench 66 is filled with trench fill material 64 that is an electrical insulating material. As before, the nanocluster region 76 is a region where nanoclusters will be used. The periphery region 74 is a region where no nanoclusters will be permitted to remain. For example, in the periphery region 74 the circuitry includes high voltage transistors, logic gates, input/output (I/O) transistors and other devices that do not contain nanoclusters. An example of a device within the nanocluster region 76 is a nonvolatile memory (NVM) cell.

Figure 14:
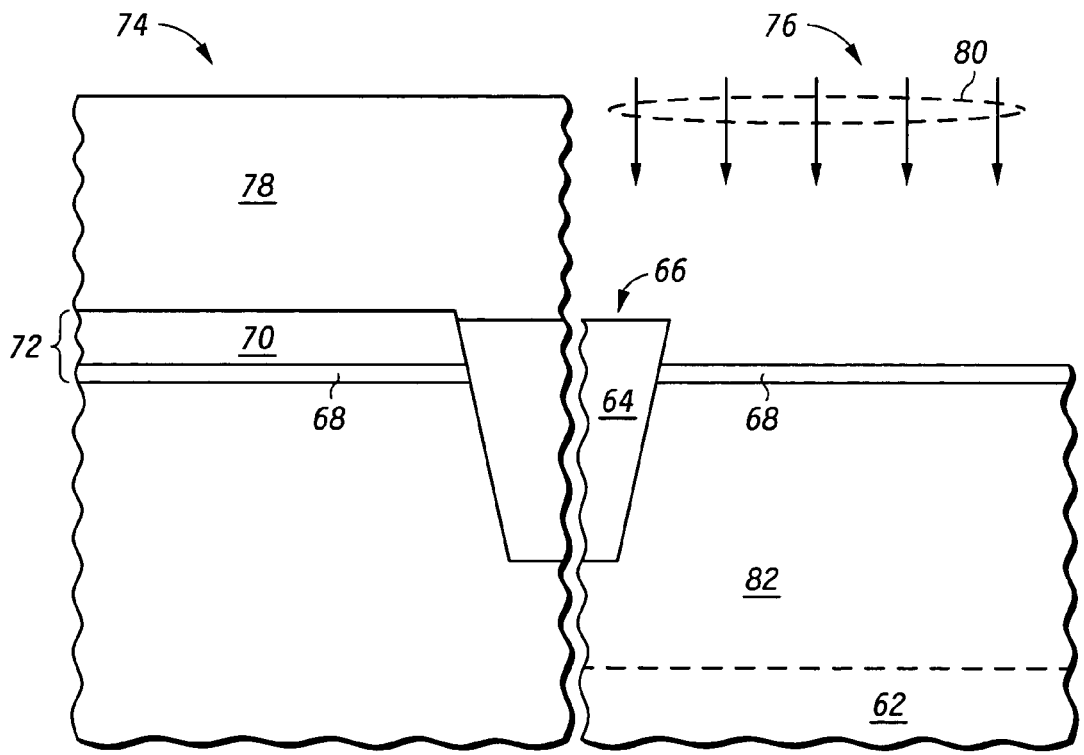

Illustrated in FIG. 14 is further processing of integrated circuit 60 wherein a mask 78 is provided overlying the periphery region 74. The mask may be any of various masking materials, such as photoresist. With mask 78 in place, an implant 80 is performed across nanocluster region 76. As a result, a well 82 is created within substrate 62. In the illustrated form, the implant 80 is performed in the absence of pad layer 70. However, alternative implementations exist. For example, pad layer 70 may remain in the nanocluster region 76 and the implant 80 implemented with pad layer 70 present.

Figure 15:
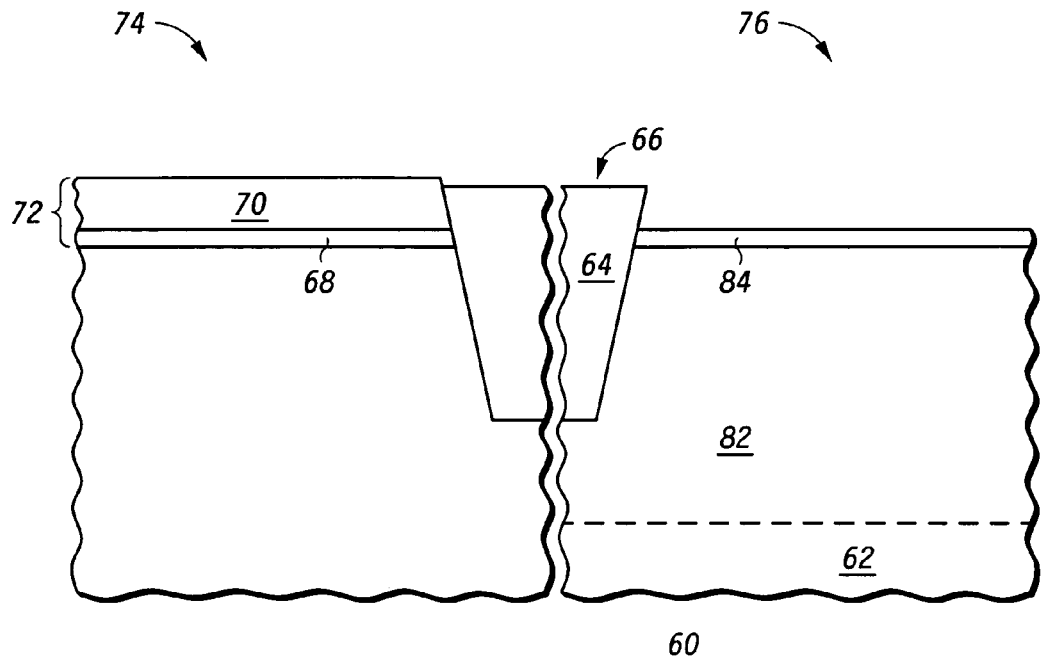

Illustrated in FIG. 15 is further processing of integrated circuit 60. Pad oxide layer 68 is removed from the nanocluster region 76 by a wet etch. The mask 78 is removed. Also, a sacrificial oxide layer 84 is thermally grown in the nanocluster region 76 above well 82. The purpose of sacrificial oxide layer 84 is to provide an undamaged upper surface of substrate 62 during subsequent processing and hence, improve the electrical characteristics (i.e. the electron mobility, etc.) of substrate 62.

Figure 16:
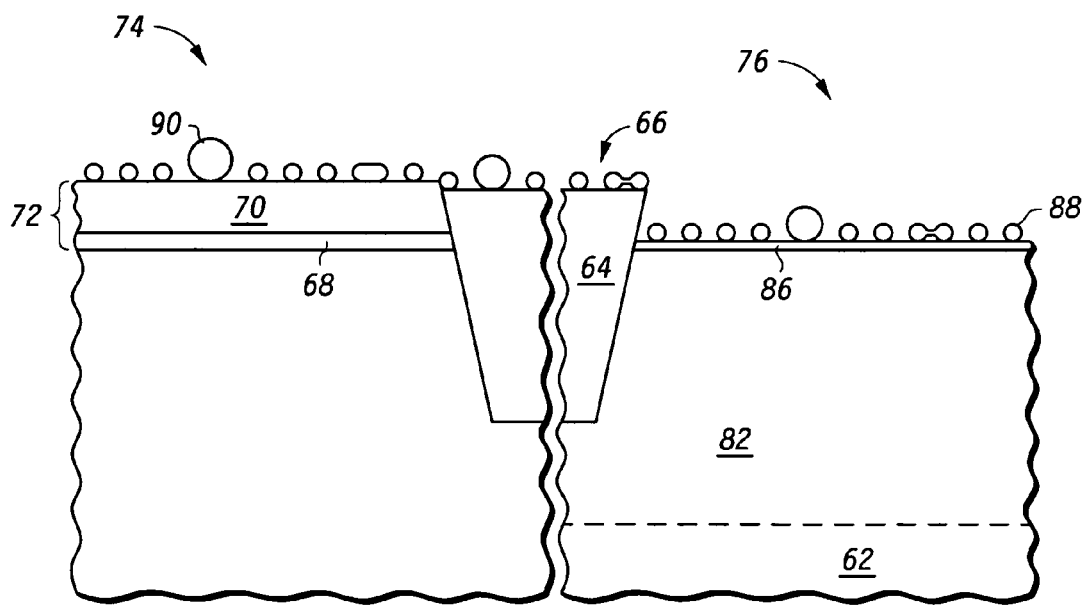

Illustrated in FIG. 16 is further processing of integrated circuit 60. At this point in time, a first or bottom oxide layer 86 is formed overlying the substrate 62 and well 82 in nanocluster region 76. The bottom oxide layer 86 functions as an electrical insulator overlying well 82. With the bottom oxide layer 86 in place, nanoclusters 88 are deposited on all of the surfaces of the integrated circuit 60. As described above, the size and the shape of the nanoclusters that are deposited are randomly variable. For example, some of the nanoclusters, such as nanocluster 90, are much large in diameter than others. The nanoclusters may be composed of the same materials as described above. Nanoclusters 88 may be deposited by any of several techniques as described above.

Figure 17:
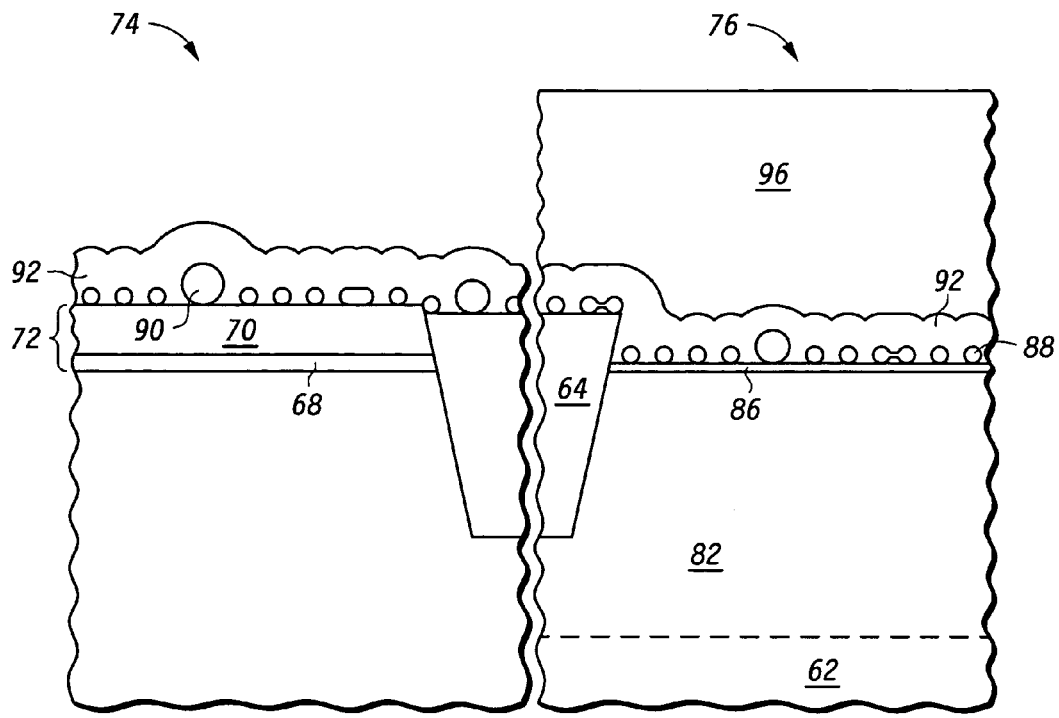

Illustrated in FIG. 17 is further processing of integrated circuit 60. A top dielectric layer 92 is deposited across the surfaces of integrated circuit 60 in both the periphery region 74 and the nanocluster region 76. The composition of top dielectric layer 92 is analogous to that described for top dielectric layer 44. A mask 96 is formed overlying the nanocluster region 76. The mask is provided by conventional techniques and may be any of conventional materials, such as photoresist.

Figure 18:
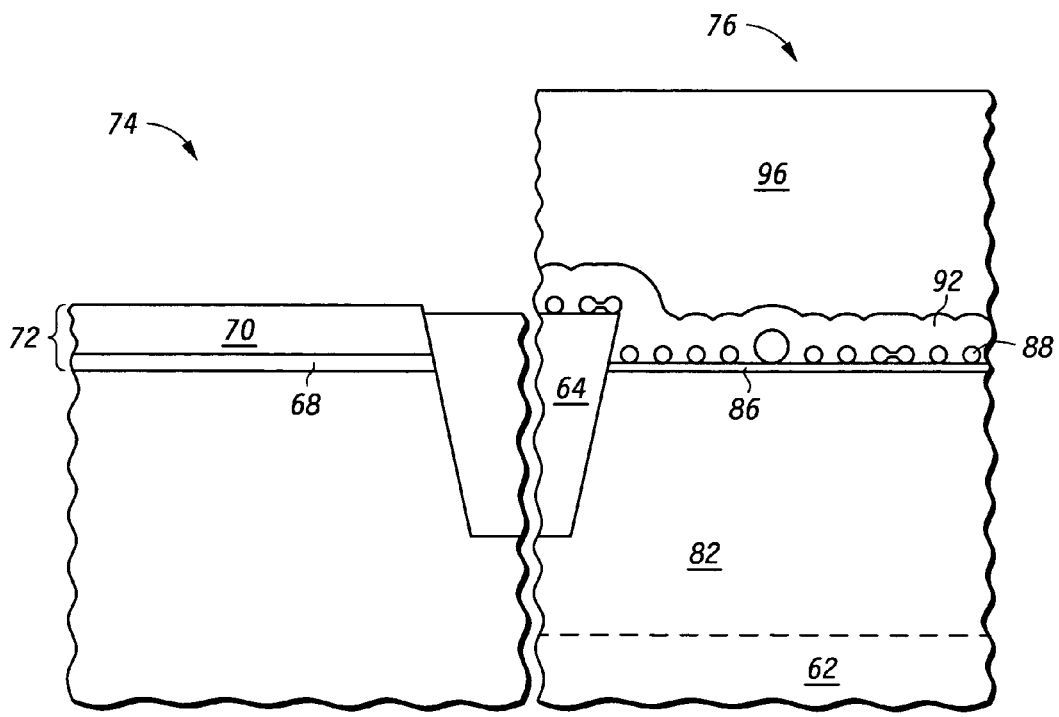

Illustrated in FIG. 18 is further processing of integrated circuit 60. The top dielectric layer 92 and nanoclusters 88 within the periphery region 74 are removed by an etch. In one form, the top dielectric layer 92 is an oxide. With an oxide top dielectric, a dry etch will have a strong endpoint signal available to distinguish between the top dielectric layer 92 and the pad layer 70 when etching away top dielectric layer 92. Therefore, the nanoclusters 88 in periphery region 74 may be etched or removed selectively to the pad layer 70 without removing a significant portion of the pad layer 70. Furthermore, because pad layer 70 is of a different material than the top dielectric layer 92, complete removal of all the nanoclusters, including the large nanoclusters may be accomplished using a single dry etch without any wet etches.

In an alternative process, the pad layer 70 within periphery region 74 has been removed subsequent to the growth of the bottom oxide layer 86. In this embodiment the nanoclusters are deposited directly upon pad oxide layer 68. In this embodiment, the pad oxide layer 68 is substantially thicker than bottom oxide layer 86. Typically pad oxide layer 68 is thicker than 10 nm while bottom oxide layer 86 is thinner than 7 nm although other dimensions may be used. Thus pad oxide layer 68 is able to tolerate a long wet etch without excessively removing oxide from the trench areas such as trench 66. Removing excessive oxide from the trench 66 may expose substrate 62, compromising the performance of devices built in the periphery region 74. In this method, large nanoclusters are undercut thoroughly without compromising the planarity of substrate 62. Nanoclusters that have been undercut and which adhere to the substrate 62 due to electrostatic forces may be subsequently pulled away using a basic (pH) solution and mechanical action as described above. During the clean steps, the previous undercutting frees the nanoclusters entrapped in the pad oxide layer 68 and top dielectric layer 92. The basic solution accompanied by mechanical action then removes the nanoclusters from the surface of the integrated circuit 60. Alternately, a dry etch to remove the nanoclusters 88 may be performed because the thickness of pad oxide layer 68 is such that a prolonged dry etch will not break through the pad oxide layer 68.

Figure 19:
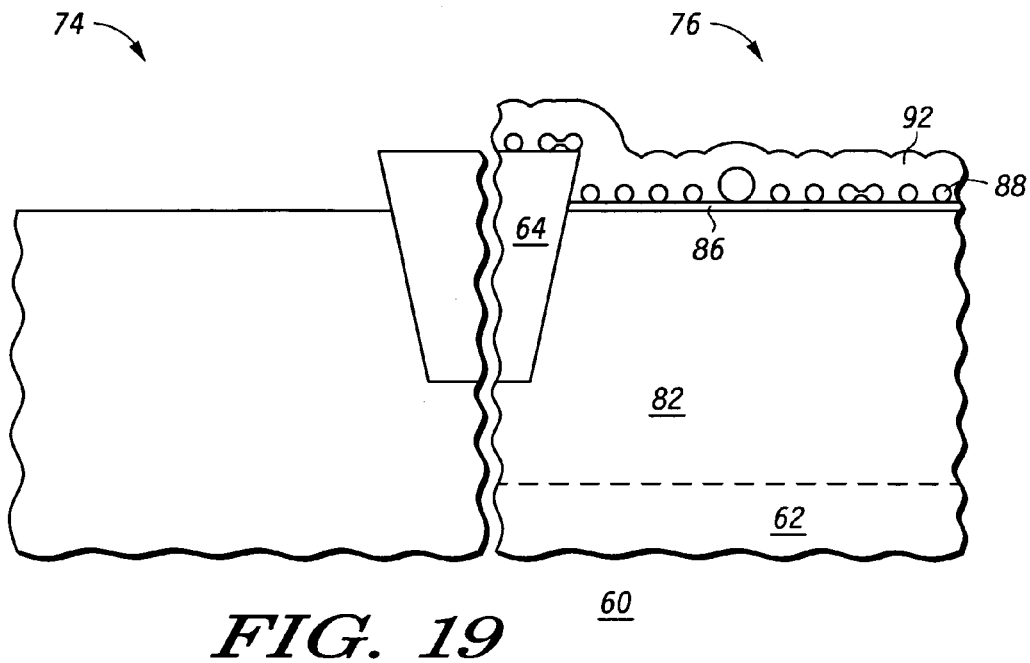

Illustrated in FIG. 19 is further processing of integrated circuit 60. At this point, the periphery region 74 has both the pad oxide layer 68 and the pad layer 70 removed. A conventional dry etch is used to etch pad layer 70. A conventional wet etch is used to etch pad oxide layer 68.

Figure 20:
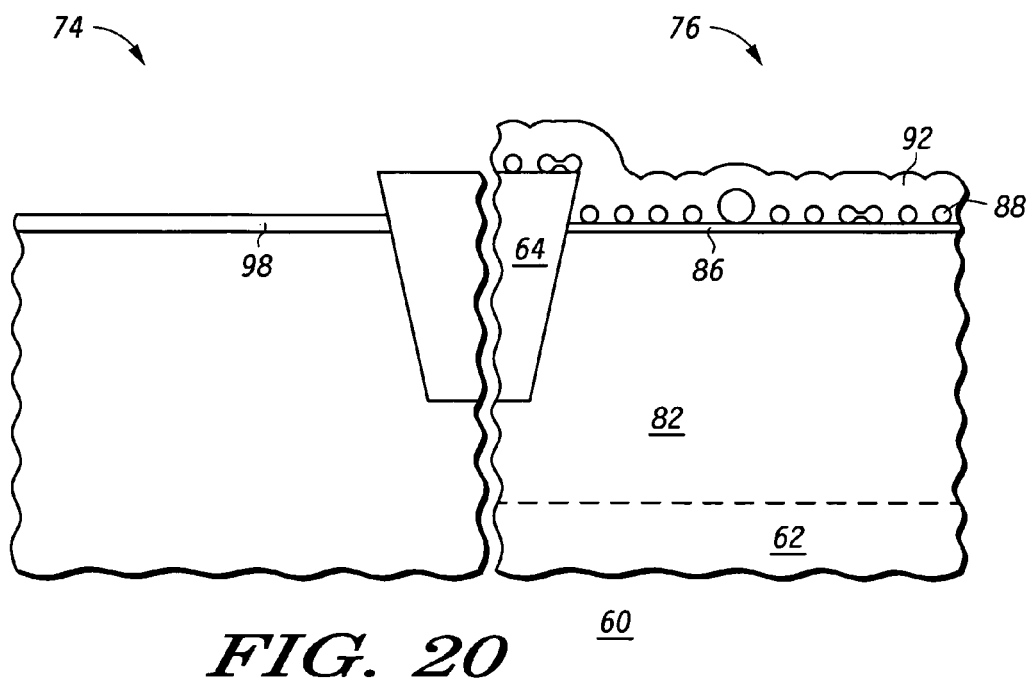

Illustrated in FIG. 20 is further processing of integrated circuit 60. At this point, in one form an optional sacrificial oxide layer (not shown) is grown over the periphery region 74. The sacrificial oxide layer (not shown) is then removed. The purpose of such an oxide layer is to improve the electrical characteristics of the silicon surface of substrate 62 and may be used as a screen oxide for implant of a well doping region (not shown). After the removal of the sacrificial oxide layer (not shown), a dielectric layer 98 is grown or deposited over the substrate 62 in periphery region 74. Top dielectric layer 92 prevents formation of the dielectric layer 98 within the nanocluster region 76.

Figure 21:
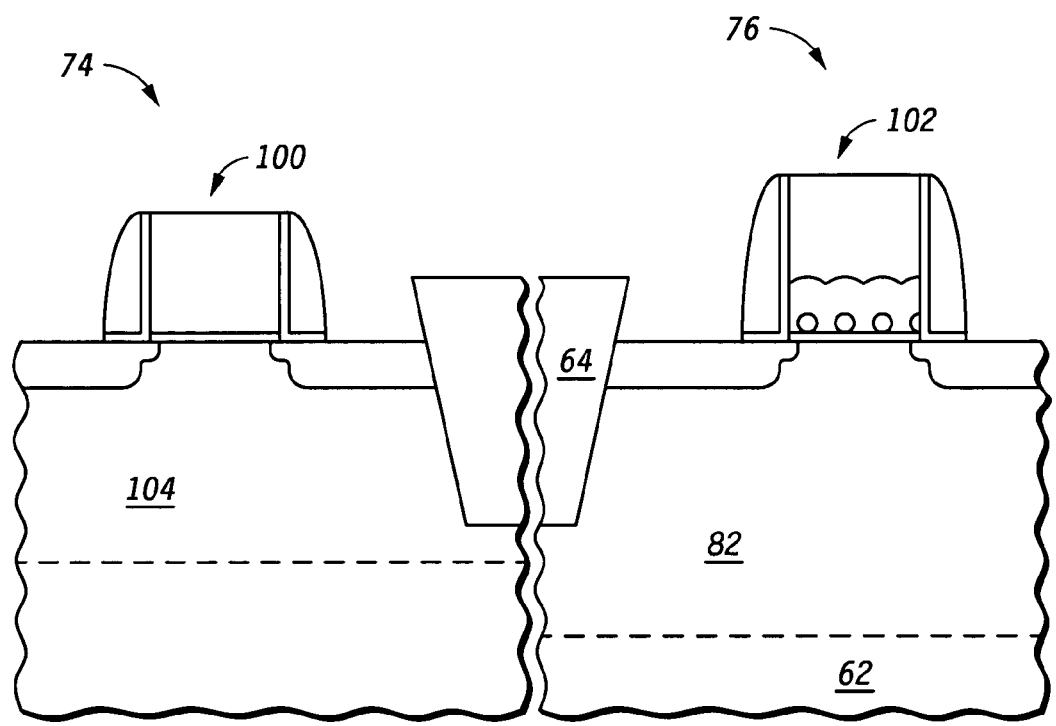

Illustrated in FIG. 21 is further processing of integrated circuit 60. A non-nanocluster device 100 is completed in periphery region 74 and a nanocluster device 102 is completed in nanocluster region 76. In the illustrated form, the non-nanocluster device 100 is a conventional transistor having sidewall spacers and self-aligned source and drain regions (not numbered) formed within a well region 104. The non-nanocluster device 100 functions as a transistor in any of a variety of predetermined types of circuit applications. In nanocluster region 76, the nanocluster device 102 functions as a memory cell and more specifically as an NVM memory cell. The nanoclusters function as a storage element for the structure. Formation of sidewall spacers and source and drain regions may be done concurrently with the formation of analogous structural elements in the non-nanocluster device 100. While specific device structures are illustrated in the form of non-nanocluster device 100 and nanocluster device 102, it should be understood that any type of electronic structure may be implemented in periphery region 74 and in nanocluster region 76. For example, the nanoclusters that are not removed in nanocluster region 76 may be used in an optical device. Any type of electronic device may be implemented in periphery region 74, including passive elements as well as active elements.

By now it should be appreciated that there has been provided methods for efficiently integrating circuitry that does not use nanoclusters with circuitry that does use nanoclusters. Deposition of nanoclusters does not readily lend itself to conventional masking techniques. For example, if a photoresist mask is used and blanket deposition of nanoclusters is implemented, the integrity of the photoresist mask will not survive the nanocluster deposition process. For example, temperatures at which the nanocluster deposition occurs are typically high enough that photoresist masks are not viable. Furthermore, when nanoclusters are deposited on a thin oxide surface, a long wet etch or dry etch is typically required to remove nanoclusters substantially larger than the mean size. Such a conventional long wet or dry etch may compromise the integrity of devices built on the periphery. Therefore, the methods provided herein provide a practical and efficient selective nanocluster deposition process. The methods provided herein will reduce topography at the silicon surface and minimize the time length and intensity required for wet cleans commonly implemented after etching.

In one form there is herein provided a method to accomplish this integration by providing a semiconductor substrate. A sacrificial layer is formed overlying a first portion of the substrate. An oxide layer is formed overlying a second portion of the semiconductor substrate. A plurality of nanoclusters is formed overlying the sacrificial layer and the oxide layer. At least the plurality of nanoclusters overlying the sacrificial layer is removed. The sacrificial layer is removed. The semiconductor substrate has a periphery region and a nanocluster region. In one form, the sacrificial layer is formed overlying the first portion of the substrate by forming the sacrificial layer over the semiconductor substrate in the periphery region, and wherein forming the plurality of nanoclusters further includes forming the plurality of nanoclusters over the sacrificial layer in the periphery region and over the semiconductor substrate in the nanocluster region. In one form the at least a portion of the plurality of nanoclusters which overlies the sacrificial layer in the periphery region is removed. A nanocluster device is formed in the nanocluster region and a non-nanocluster device in the periphery region is formed. In one form the sacrificial layer has a thickness of at least 10 nanometers. In another form the sacrificial layer is at least one of a nitride or an oxide. In another form the sacrificial layer is an oxide which etches faster than a thermal oxide. A material of the sacrificial layer is selected such that the plurality of nanoclusters is selectively removable with respect to the sacrificial layer. Forming the sacrificial layer includes depositing at least one of a nitride-containing layer over the semiconductor substrate, an oxide-containing layer over the semiconductor substrate, or a polysilicon-containing layer over the semiconductor substrate. In one form the sacrificial layer is at least one of a pad oxide or a pad nitride. The sacrificial layer is formed by forming at least one of a pad oxide layer and a pad nitride layer over the semiconductor substrate. Isolation regions in the semiconductor substrate are formed using the at least one of the pad oxide layer and the pad nitride layer. A clean is performed after removing the at least a portion of the plurality of nanoclusters and prior to removing the sacrificial layer. The clean is implemented with a composition that has a basic pH to overcome electrostatic attraction of the plurality of nanoclusters to the sacrificial layer and to the semiconductor substrate. In one form the clean is implemented with a mechanical action to remove the plurality of nanoclusters from the sacrificial layer and from the semiconductor substrate.

In another form there is provided a method that provides a semiconductor substrate having a periphery region and a nanocluster region. A first sacrificial layer is deposited over the semiconductor substrate in the periphery region and in the nanocluster region. A portion of the first sacrificial layer in the nanocluster region is removed. An insulating layer over the semiconductor substrate in the nanocluster region is formed. A plurality of nanoclusters is formed over the semiconductor substrate, wherein the plurality of nanoclusters is formed over a remaining portion of the first sacrificial layer in the periphery region and over the insulating layer in the nanocluster region. A patterned masking layer is formed over the plurality of nanoclusters in the nanocluster region. The plurality of nanoclusters which overlie the first sacrificial layer in the periphery region and the remaining portion of the first sacrificial layer is removed. In another form a second sacrificial layer is formed over the semiconductor substrate, wherein depositing the first sacrificial layer comprises depositing the first sacrificial layer over the second sacrificial layer.

In the foregoing specification, the invention has been described with reference to specific embodiments. However, one of ordinary skill in the art appreciates that various modifications and changes can be made without departing from the scope of the present invention as set forth in the claims below. For example, any type of electronic devices, whether MOS, optoelectronic, bipolar, SOI and others may be used. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method, comprising:
   providing a semiconductor substrate comprising a periphery region and a nanocluster region;
   forming a sacrificial layer overlying a first portion of the semiconductor substrate in the periphery region;
   forming an oxide layer overlying a second portion of the semiconductor substrate;
   forming a plurality of nanoclusters overlying the sacrificial layer in the periphery region and overlying the semiconductor substrate in the nanocluster region;
   removing at least the plurality of nanoclusters overlying the sacrificial layer in the periphery region; and
   before removing the sacrificial layer, performing a clean after removing the at least the plurality of nanoclusters overlying the sacrificial layer in the periphery region.

2. The method of claim 1, further comprising forming a nanocluster device in the nanocluster region and forming a non-nanocluster device in the periphery region.

3. The method of claim 1, wherein the sacrificial layer has a thickness of at least 10 nanometers.

4. The method of claim 1, wherein the sacrificial layer comprises at least one of a nitride or an oxide.

5. The method of claim 1, wherein the sacrificial layer comprises an oxide which etches faster than a thermal oxide.

6. The method of claim 1, wherein a material of the sacrificial layer is selected such that the plurality of nanoclusters are selectively removable with respect to the sacrificial layer.

7. The method of claim 1, wherein the sacrificial layer comprises at least one of a pad oxide or a pad nitride.

8. The method of claim 7, wherein forming the sacrificial layer comprises:
    forming at least one of a pad oxide layer or a pad nitride layer over the semiconductor substrate; and
    forming isolation regions in the semiconductor substrate using the at least one of the pad oxide layer or the pad nitride layer.

9. The method of claim 1 further comprising:
    implementing the clean with a composition that has a basic pH to overcome electrostatic attraction of the plurality of nanoclusters to the sacrificial layer and to the semiconductor substrate.

10. The method of claim 1 further comprising:
    implementing the clean with a mechanical action to remove the plurality of nanoclusters from the sacrificial layer and from the semiconductor substrate.

11. A method, comprising:
    providing a semiconductor substrate;
    forming a sacrificial layer overlying a first portion of the semiconductor substrate by depositing at least one of a nitride-containing layer over the semiconductor substrate, an oxide-containing layer over the semiconductor substrate, or a polysilicon-containing layer over the semiconductor substrate;
    forming an oxide layer overlying a second portion of the semiconductor substrate;
    forming a plurality of nanoclusters overlying the sacrificial layer and the oxide layer;
    removing at least the plurality of nanoclusters overlying the sacrificial layer; and
    before removing the sacrificial layer, performing a clean after removing the at least the plurality of nanoclusters overlying the sacrificial layer.

12. A method, comprising:
    providing a semiconductor substrate having a periphery region and a nanocluster region;
    depositing a first sacrificial layer over the semiconductor substrate in the periphery region and in the nanocluster region;
    removing a portion of the first sacrificial layer in the nanocluster region;
    forming an insulating layer over the semiconductor substrate in the nanocluster region;
    forming a plurality of nanoclusters over the semiconductor substrate, wherein the plurality of nanoclusters is formed over a remaining portion of the first sacrificial layer in the periphery region and over the insulating layer in the nanocluster region;
    forming a patterned masking layer over the plurality of nanoclusters in the nanocluster region; and
    removing the plurality of nanoclusters which overlie the first sacrificial layer in the periphery region and the remaining portion of the first sacrificial layer.

13. The method of claim 12, further comprising forming a second sacrificial layer over the semiconductor substrate, wherein depositing the first sacrificial layer comprises depositing the first sacrificial layer over the second sacrificial layer.

14. The method of claim 13, wherein the first sacrificial layer comprises at least one of a nitride or an oxide, and wherein the second sacrificial layer comprises an oxide.

15. The method of claim 12, wherein removing the plurality of nanoclusters which overlie the first sacrificial layer in the periphery region and the remaining portion of the first sacrificial layer comprises:
    performing a clean after removing the plurality of nanoclusters which overlie the first sacrificial layer in the periphery region and prior to removing the remaining portion of the first sacrificial layer.

16. The method of claim 12, further comprising forming a nanocluster device in the nanocluster region using at least a portion of the plurality of nanoclusters over the insulating layer in the nanocluster region and forming a non-nanocluster device in the periphery region.

17. A method, comprising:
    providing a semiconductor substrate having a periphery region and a nanocluster region;
    forming a first pad layer over the semiconductor substrate in the periphery region and in the nanocluster region;
    forming isolation regions in the semiconductor substrate using the first pad layer, wherein the isolation regions extend through the first pad layer into the semiconductor substrate;
    removing a portion of the first pad layer in the nanocluster region;
    forming an insulating layer over the semiconductor substrate in the nanocluster region;
    forming a plurality of nanoclusters over the semiconductor substrate, wherein the plurality of nanoclusters is formed over a remaining portion of the first pad layer in the periphery region and over the insulating layer in the nanocluster region;
    forming a patterned masking layer over the plurality of nanoclusters in the nanocluster region; and
    removing the plurality of nanoclusters which overlie the first pad layer in the periphery region and the remaining portion of the first pad layer.

18. The method of claim 17, further comprising forming a second pad layer over the semiconductor substrate in the periphery region and in the nanocluster region, wherein the first pad layer is formed over the second pad layer, and wherein forming isolation regions comprises:
    forming isolation regions in the semiconductor substrate using the first and second pad layers, wherein the isolation regions extend through the first and second pad layers into the semiconductor substrate.

19. The method of claim 17, further comprising:
    removing a portion of the second pad layer in the nanocluster region prior to forming the insulating layer, and
    removing a remaining portion of the second pad layer in the periphery region after removing the plurality of nanoclusters.

20. The method of claim 17, wherein the first pad layer comprises a nitride and the second pad layer comprises an oxide.

21. The method of claim 17, further comprising forming a second pad layer over the first pad layer in the periphery region and in the nanocluster region, wherein forming isolation regions comprises:

forming isolation regions in the semiconductor substrate using the first pad layer and the second pad layer, wherein the isolation regions extend through the first pad layer and the second pad layer into the semiconductor substrate.

22. The method of claim 21, further comprising:

removing the second pad layer in the periphery region and in the nanocluster region prior to removing the portion of the first pad layer in the nanocluster region.

23. The method of claim 21, wherein the first pad layer comprises an oxide and the second pad layer comprises a nitride.

24. The method of claim 17, wherein the first pad layer comprises at least one of an oxide or a nitride.

25. The method of claim 17, wherein removing the plurality of nanoclusters which overlie the first pad layer in the periphery region and the remaining portion of the first pad layer comprises:

performing a clean after removing the plurality of nanoclusters which overlie the first pad layer in the periphery region and prior to removing the remaining portion of the first pad layer.

26. The method of claim 17, further comprising forming a nanocluster device in the nanocluster region using at least a portion of the plurality of nanoclusters over the insulating layer in the nanocluster region and forming a non-nanocluster device in the periphery region.

* * * * *